(12) United States Patent
Nishimura et al.

(10) Patent No.: US 7,116,208 B2
(45) Date of Patent: Oct. 3, 2006

(54) PRINTED-CIRCUIT BOARD WITH FUSE

(75) Inventors: Kohshi Nishimura, Kyoto (JP); Satoshi Nakamura, Kyoto (JP); Saizou Suzuki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/062,297

(22) Filed: Feb. 17, 2005

(65) Prior Publication Data

US 2005/0140490 A1 Jun. 30, 2005

Related U.S. Application Data

(62) Division of application No. 10/221,616, filed as application No. PCT/JP01/01990 on Mar. 13, 2001, now abandoned.

(30) Foreign Application Priority Data

| Mar. 14, 2000 | (JP) | ............................... 2000-70733 |
| Mar. 14, 2000 | (JP) | ............................... 2000-70734 |
| Mar. 21, 2000 | (JP) | ............................... 2000-77641 |

(51) Int. Cl.
*H01H 85/08* (2006.01)
*H01H 85/48* (2006.01)

(52) U.S. Cl. ...................... 337/296; 337/297

(58) Field of Classification Search ............... 337/297, 337/296, 159, 227, 290
See application file for complete search history.

(56) References Cited

U.S. PATENT DOCUMENTS

| 2,934,627 | A | * | 4/1960 | Bristol et al. ............... 337/293 |
| 3,334,205 | A | * | 8/1967 | Griffin ......................... 337/198 |
| 3,358,363 | A | | 12/1967 | Jacks et al. |
| 3,585,556 | A | | 6/1971 | Hingorany et al. |
| 4,296,398 | A | | 10/1981 | McGalliard |
| 4,379,318 | A | | 4/1983 | Ootsuka |
| 4,394,639 | A | * | 7/1983 | McGalliard .................. 337/292 |
| 4,626,818 | A | | 12/1986 | Hilgers |
| 4,652,848 | A | | 3/1987 | Hundrieser |
| 4,873,506 | A | * | 10/1989 | Gurevich ..................... 337/290 |
| 5,097,246 | A | * | 3/1992 | Cook et al. ................. 337/297 |
| 5,097,247 | A | | 3/1992 | Doerrwaechter |
| 5,099,219 | A | | 3/1992 | Roberts |
| 5,130,689 | A | | 7/1992 | Raykhtsaum et al. |
| 5,309,625 | A | * | 5/1994 | Onishi ......................... 29/623 |
| 5,543,774 | A | | 8/1996 | Lof |
| 5,644,281 | A | | 7/1997 | Kuriyama |
| 5,682,057 | A | | 10/1997 | Kuriyama |
| 5,777,540 | A | | 7/1998 | Dedert et al. |
| 5,914,649 | A | * | 6/1999 | Isono et al. ................. 337/290 |
| 5,923,239 | A | * | 7/1999 | Krueger et al. ............. 337/297 |
| 6,384,708 | B1 | * | 5/2002 | Jollenbeck et al. ......... 337/297 |

FOREIGN PATENT DOCUMENTS

JP 51-47864 4/1976

(Continued)

*Primary Examiner*—Anatoly Vortman
(74) *Attorney, Agent, or Firm*—Hamre, Schumann, Mueller & Larson, P.C.

(57) ABSTRACT

A printed wiring board includes a substrate (20) on which a wiring pattern (12) has been formed, and a fuse (6) provided on the substrate (20). One end of the fuse (6) is directly connected to a first pad (12*a*) of the wiring pattern (12), and the other end of the fuse (6) is directly connected to a second pad (12*b*) of the wiring pattern (12). The fuse (6) is covered by a protective material (7).

4 Claims, 16 Drawing Sheets

FOREIGN PATENT DOCUMENTS

| | | |
|---|---|---|
| JP | 53-109058 | 9/1978 |
| JP | 55-71574 | 5/1980 |
| JP | 55-108777 | 7/1980 |
| JP | 58-182343 | 12/1983 |
| JP | 02-281649 | 11/1990 |
| JP | 05-120985 | 5/1993 |
| JP | 05258653 A | 10/1993 |
| JP | 06-069626 | 3/1994 |
| JP | 2000311959 A | 11/2000 |

\* cited by examiner

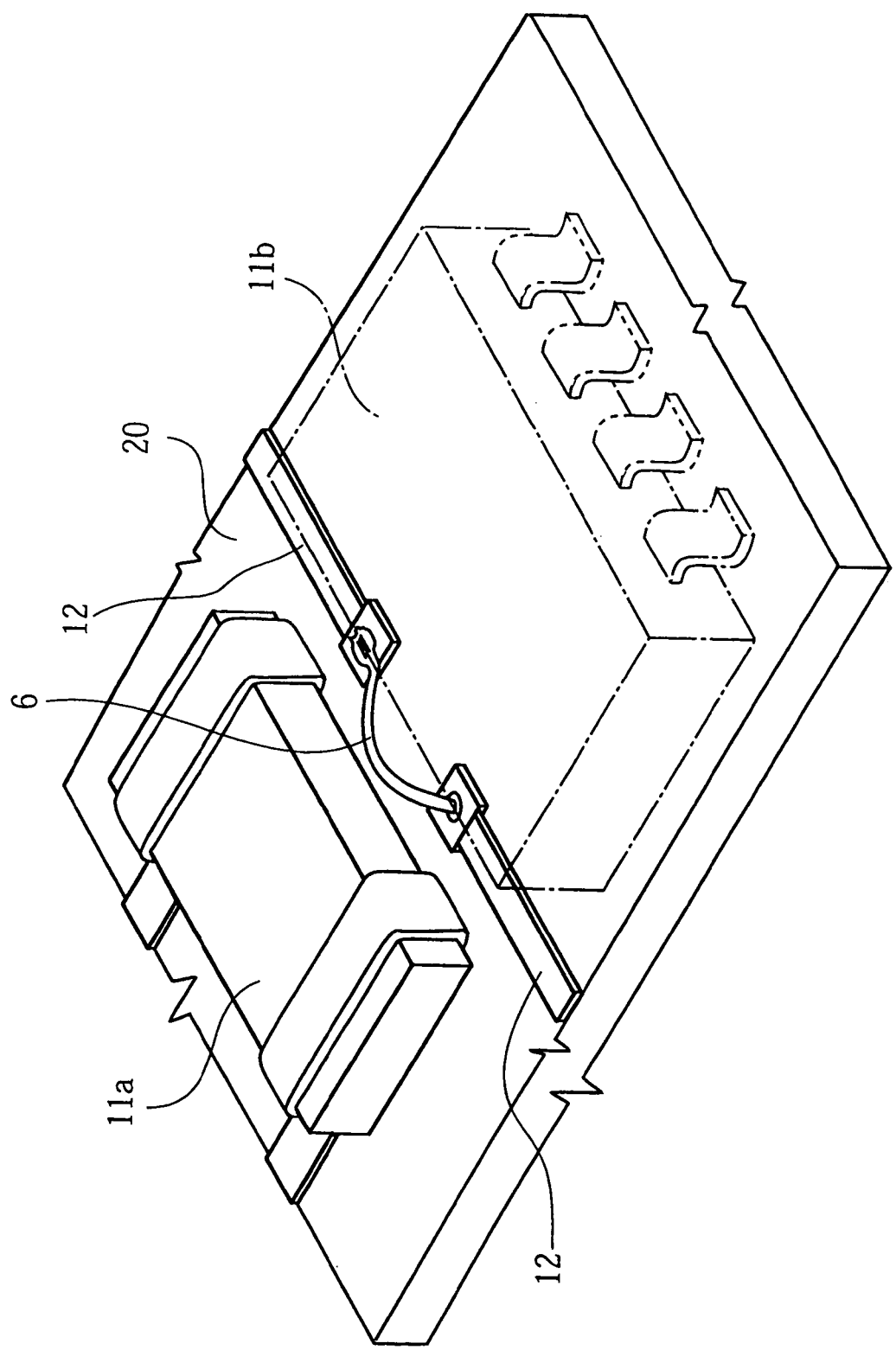

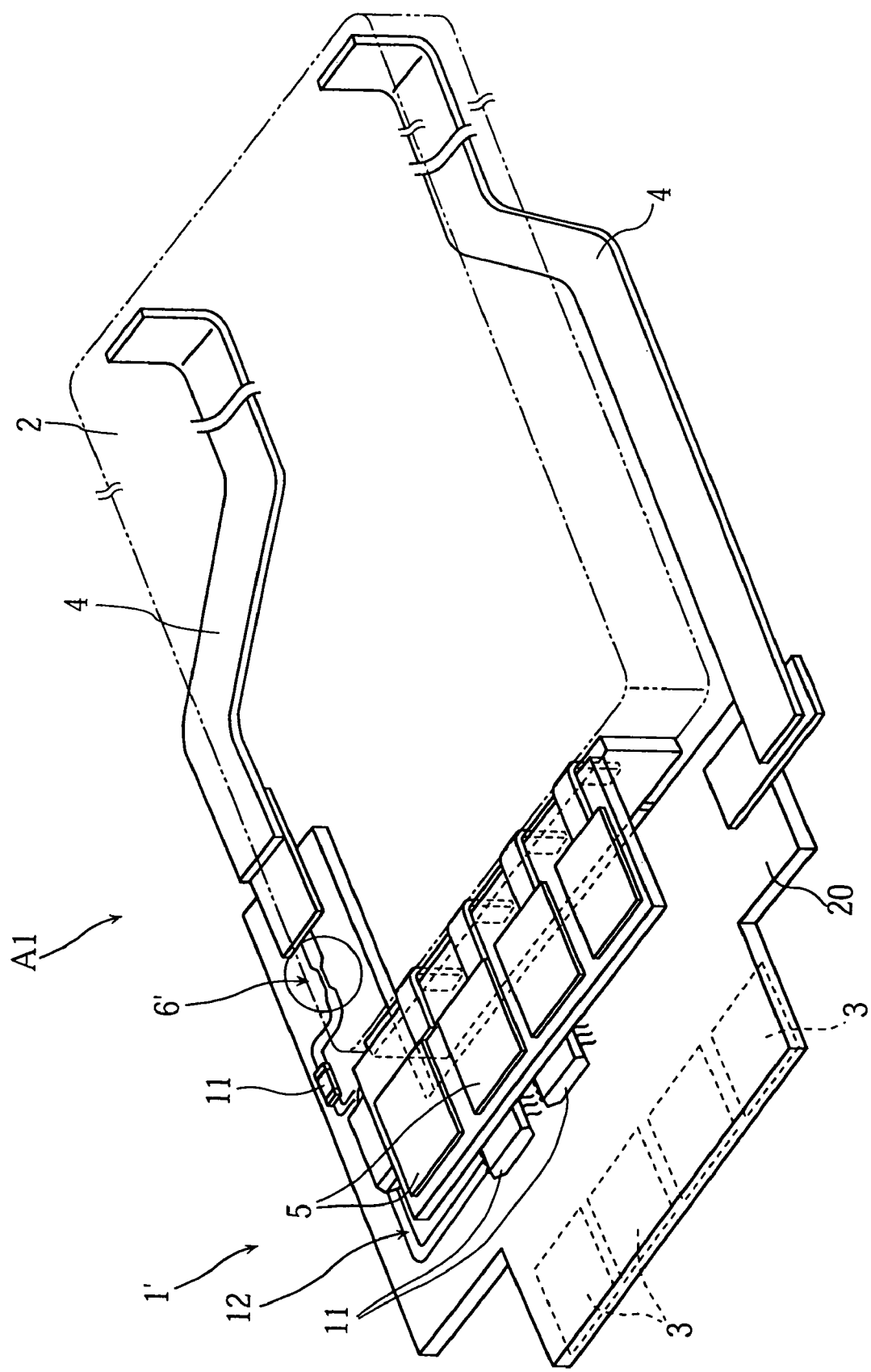

PRINTED-CIRCUIT BOARD WITH FUSE

This application is a division of application Ser. No. 10/221,616, filed Sep. 12, 2002 now abandoned, which application is incorporated herein by reference.

TECHNICAL FIELD

This invention relates to a printed wiring board equipped with a fuse.

BACKGROUND ART

Printed wiring boards equipped with fuses for circuit protection have been used in the past in a wide variety of electronic devices. FIG. 16 of this application illustrates a printed wiring board 101 used in a battery pack for a cellular telephone. This printed wiring board 101 is equipped with an insulating substrate 102, on which a specific wiring pattern (not shown) is formed. Also, a protection circuit 10 and a fuse 110 are mounted on this insulating substrate 102. The protection circuit 10 serves to prevent the overcharging of a battery 2, and consists of transistors or various other such electronic parts 11. The fuse 110 works as a failsafe device in the event that the protection circuit 10 should not function properly, and keeps excess current from flowing into the circuit.

The printed wiring board 101 is further provided with a charging terminal 3 for bringing electricity from a household outlet or the like to the battery 2. This electricity is supplied from a metal terminal 4, through the protection circuit 10 and the fuse 110, and to the battery 2.

As shown in FIG. 17, the fuse 110 is equipped with a package 111 composed of an epoxy resin or the like, and leads 112a and 112b which protrude in opposite directions from this package 111. The package 111 is hollow, and an electroconductive material that will melt at a specific temperature is disposed on the inside thereof. The leads 112a and 112b are electrically connected to each other via this conductive member inside the package 111.

A problem encountered with the conventional printed wiring board 101 described above was that the size of the fuse 110 was different from that of the electronic parts 11. Consequently, some chip mounters for mounting the electronic parts 11 were unable to mount the fuse 110 on the insulating substrate 102, which meant that the fuse 110 had to be mounted manually, and this lowered the working efficiency. Furthermore, the fuse 110 tended to be bulky because it had the package 111. This hindered efforts at reducing the size of the printed wiring board 101.

DISCLOSURE OF THE INVENTION

The present invention has been conceived in light of the above situation, and it is an object thereof to provide a compact, fused printed wiring board by a simple and inexpensive means.

The printed wiring board provided by the present invention comprises an insulating substrate on which a wiring pattern has been formed, and a fuse including a circuit breaking means. The circuit breaking means is directly connected to the wiring pattern.

In a preferred embodiment of the present invention, the wiring pattern includes two conductor pads that are apart from each other, and the circuit breaking means bridges the two conductor pads.

Preferably, the circuit breaking means is covered with a protective material.

Preferably, the printed wiring board further comprises at least one electronic part mounted on the substrate, and the circuit breaking means is disposed lower than the electronic part.

Preferably, the circuit breaking means is a solder wire.

Preferably, the printed wiring board further comprises a heat insulating means disposed in the vicinity of the circuit breaking means.

In another preferred embodiment of the present invention, the circuit breaking means is formed integrally with the wiring pattern. In this case, the circuit breaking means is a relatively narrow portion of the wiring pattern, for example.

Preferably, the wiring pattern is composed of copper.

Preferably, the printed wiring board further comprises a resist layer that covers the wiring pattern, and the heat insulating means includes an opening formed in the resist layer.

Preferably, the heat insulating means is a through hole or a recess provided to the substrate. The circuit breaking means bridges the through hole or recess. Alternatively, the circuit breaking means may be provided inside the through hole.

In another preferred embodiment of the present invention, the printed wiring board further comprises an additional insulating substrate. The heat insulating means includes a through hole or recess formed in the additional insulating substrate.

Other features and advantages of the present invention should become clearer from the following detailed description through reference to the appended drawings.

BRIEF DESCRIPTION OF THE DRAWINGS

FIGS. 4A and 4B are diagrams of an example of how the fuse in FIG. 2 is disposed;

FIG. 5 is a perspective view of the main portions of a battery pack that incorporates the printed wiring board pertaining to a second embodiment of the present invention;

BEST MODE FOR CARRYING OUT THE INVENTION

Preferred embodiments of the present invention will now be described in specific terms through reference to the appended drawings.

Figure 1:
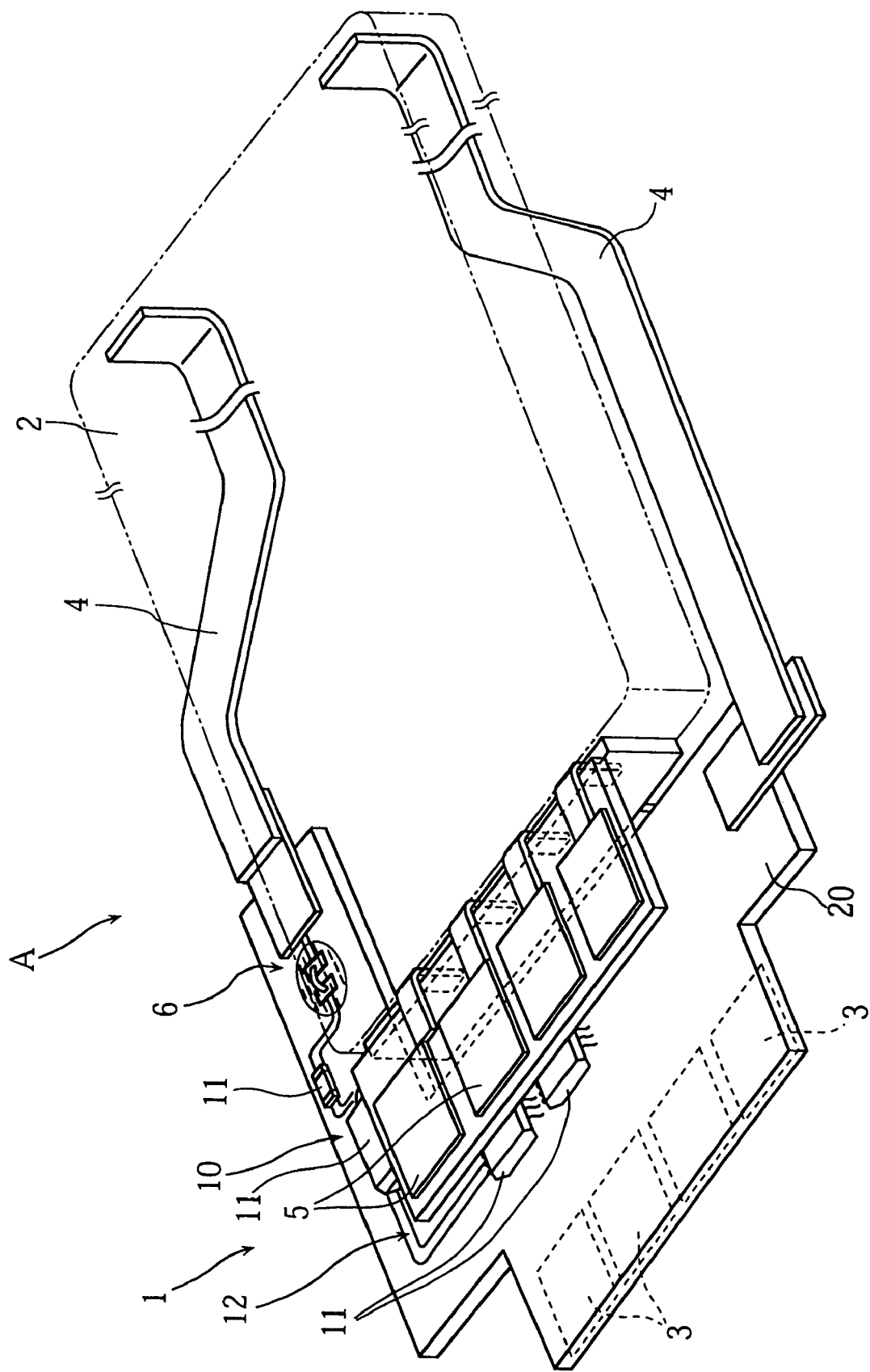
FIG. 1 is a perspective view of the main portion of a battery pack that incorporates the printed wiring board pertaining to a first embodiment of the present invention.

FIG. 1 illustrates the main portion of a battery pack A that incorporates the printed wiring board 1 pertaining to a first embodiment of the present invention. The battery pack A is equipped with a chargeable battery 2, which can be used, for instance, as a drive power source of a cellular telephone. The battery 2 is connected via two metal conductors 4 to a wiring pattern 12 (only partially depicted) formed on the wiring board 1. The wiring board 1 includes a substrate 20 composed of an insulating material (such as glass epoxy), and on the back side thereof are formed four terminals 3 for receiving the supply of electricity from an external power source and charging the battery 2. Four terminals 5 for supplying electricity from the battery 2 to the outside are provided on the top side of the wiring board 1.

Figure 2:
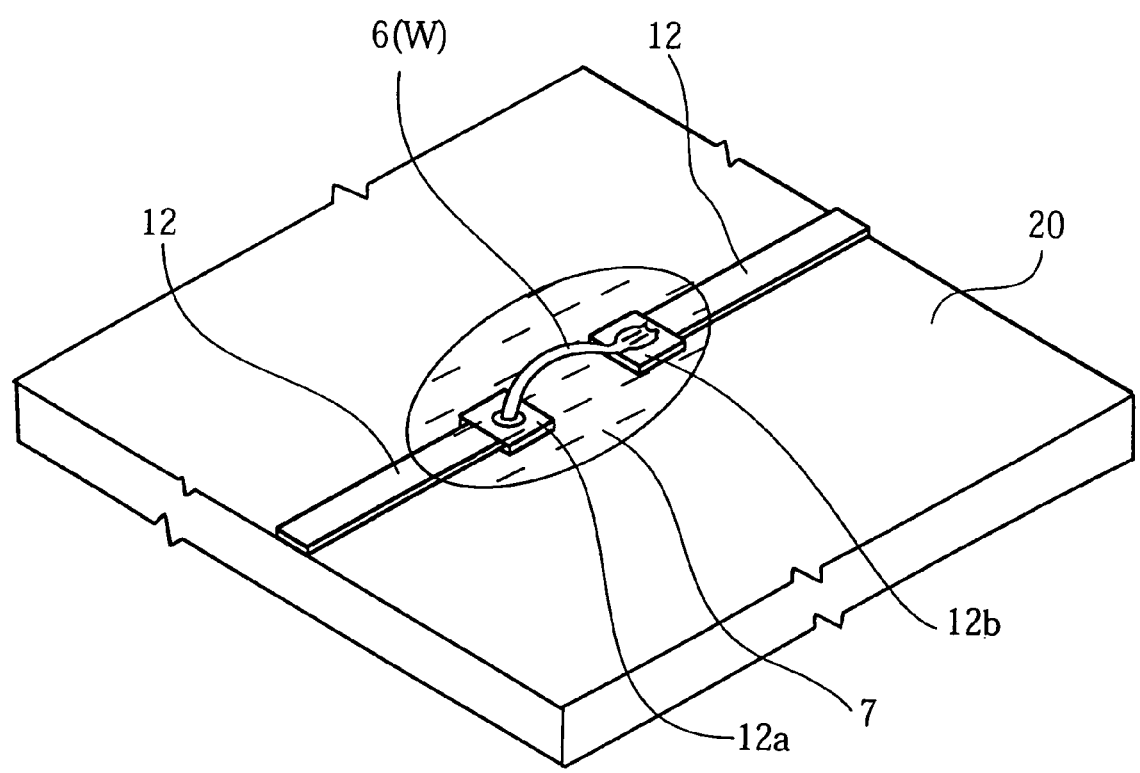
FIG. 2 is a detail view of the fuse provided to the above-mentioned printed wiring board.

A protection circuit 10 for preventing excess current from flowing into the battery 2 during charging is provided to the wiring board 1. The protection circuit 10 consists of transistors or various other such electronic parts 11. A fuse 6 is also provided to the wiring board 1. As shown in FIG. 2, two conductor pads 12a and 12b are formed as part of the wiring pattern 12 on the substrate 20. The fuse 6 bridges these conductor pads 12a and 12b. The fuse 6 melts and breaks the circuit when current over the safe level flows through the wiring pattern 12.

The wiring pattern 12 can be formed, for example, by forming a thin film of copper on the substrate 20, then removing the unnecessary portion by photolithography. Preferably, the surface of the conductor pads 12a and 12b are plated with gold, for instance, after the formation of the wiring pattern 12. This allows the fuse 6 to be connected well to the conductor pads 12a and 12b.

Figure 3:
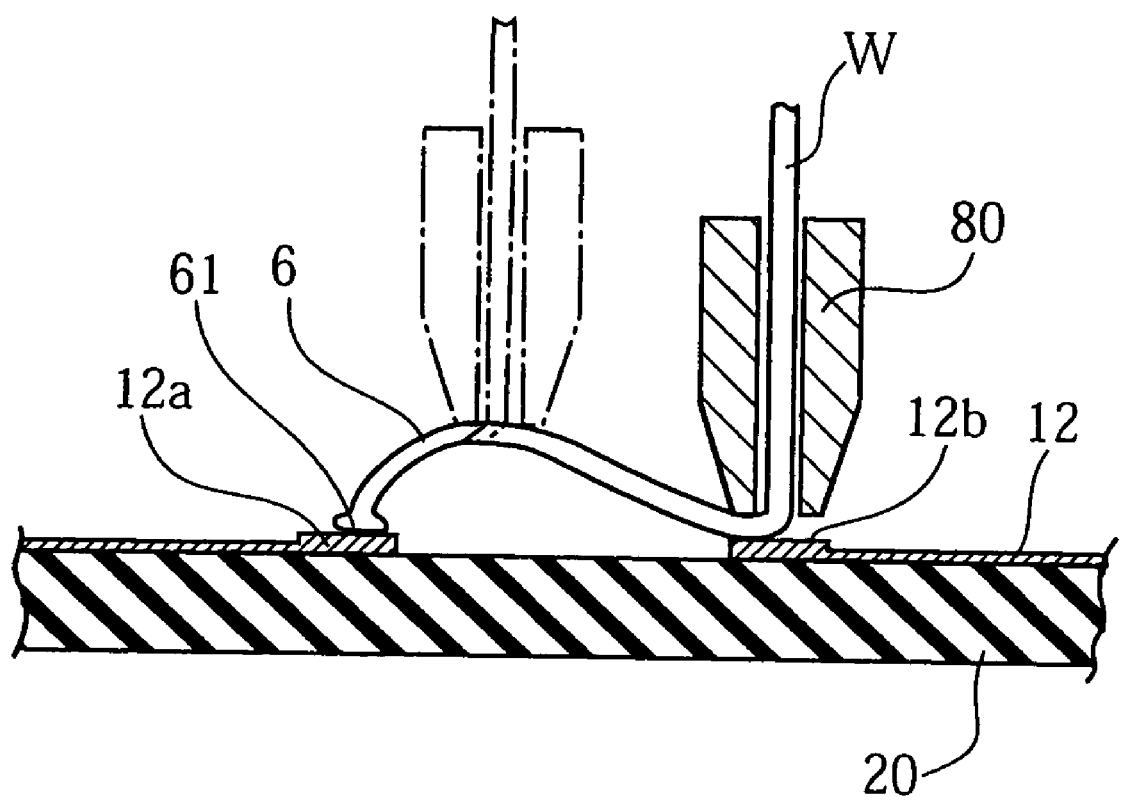
FIG. 3 is a diagram illustrating how the fuse in FIG. 2 is formed.

As shown in FIG. 3, the fuse 6 can be formed by bridging the conductor pads 12a and 12b with a wire W by wire bonding method. More specifically, the wire W (such as a solder wire) is first inserted into a capillary 80, and the tip thereof is made to stick out from the capillary 80. Next, the tip of the wire W is melted with a hydrogen flame or the like to form a ball 61. The capillary 80 is then operated so that the ball 61 is press-bonded to the conductor pad 12a. Preferably, the capillary 80 is subjected to high-frequency vibration at this point. This results in the wire W being more securely connected to the conductor pad 12a.

The capillary 80 is then moved to where the other conductor pad 12b is located. The wire W remains connected to the first conductor pad 12a, and is played out from the tip of the capillary 80 according to the movement of the capillary 80. The capillary 80 is then operated so that the wire W is press-bonded to the second conductor pad 12b (preferably, the capillary 80 is subjected to high-frequency vibration at this point). Finally, the capillary 80 is moved laterally (to the right in FIG. 3) without playing out the wire W from the capillary 80. This breaks the wire W at the location of the second conductor pad 12b, and the fuse 6 is obtained. As shown in FIG. 2, the fuse 6 obtained in this manner may be covered with a potting material 7 for protection. The potting material 7 can be formed, for example, by dropping the liquefied glass epoxy resin from above the fuse 6.

With the first embodiment given above, the fuse 6 can be easily formed on the substrate 20 by a conventional wire bonding process. Therefore, no special mounting equipment is needed for the fuse 6, which lowers the manufacturing cost and improves manufacturing efficiency.

Figure 4B:
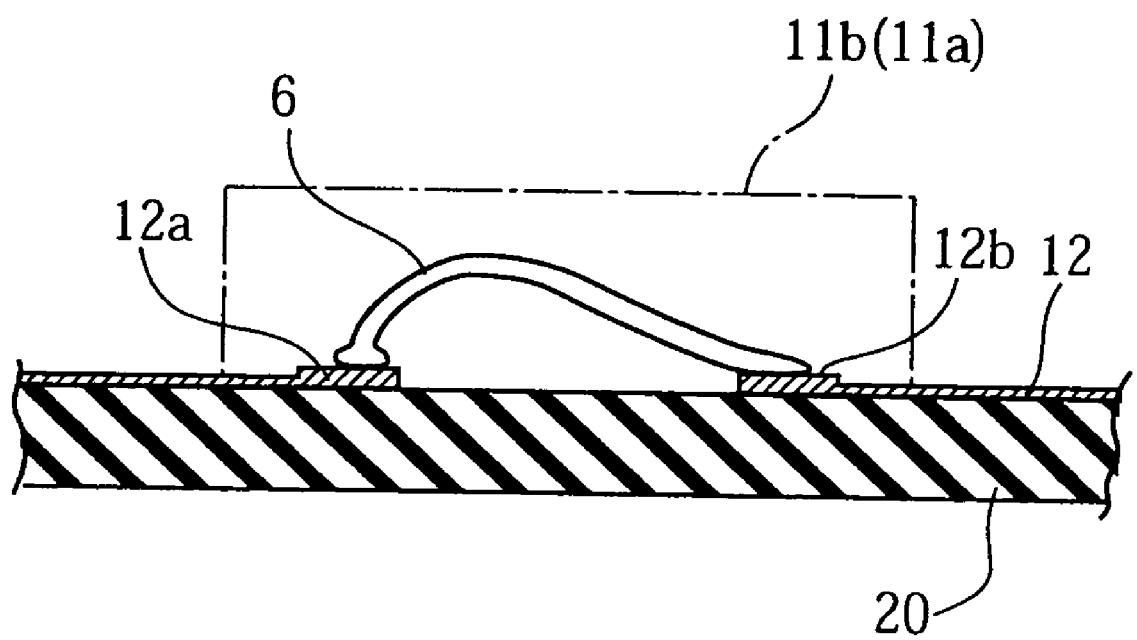

Also, the fuse 6 consists of just a single piece of wire, and doesn't take up much space on the wiring board 1. Thus, as shown in FIG. 4A, it is also possible to provide the fuse 6 between two adjacent electronic parts 11a and 11b. Preferably, as shown in FIG. 4B, the fuse 6 does not stick up above the tops of the electronic parts 11a and 11b. If [the fuse 6] is thus surrounded by the electronic parts 11a and 11b, the fuse 6 can be protected without providing the potting material 7 (FIG. 2).

FIG. 5 the main portions of a battery pack A1 that incorporates the printed wiring board 1' pertaining to a second embodiment of the present invention. Just as with the printed wiring board 1 described above, the printed wiring board 1' in FIG. 5 includes an insulating substrate 20, over which four charging terminals 3, a fuse 6', electronic parts 11, a wiring pattern 12, and so forth are provided.

Figure 6:
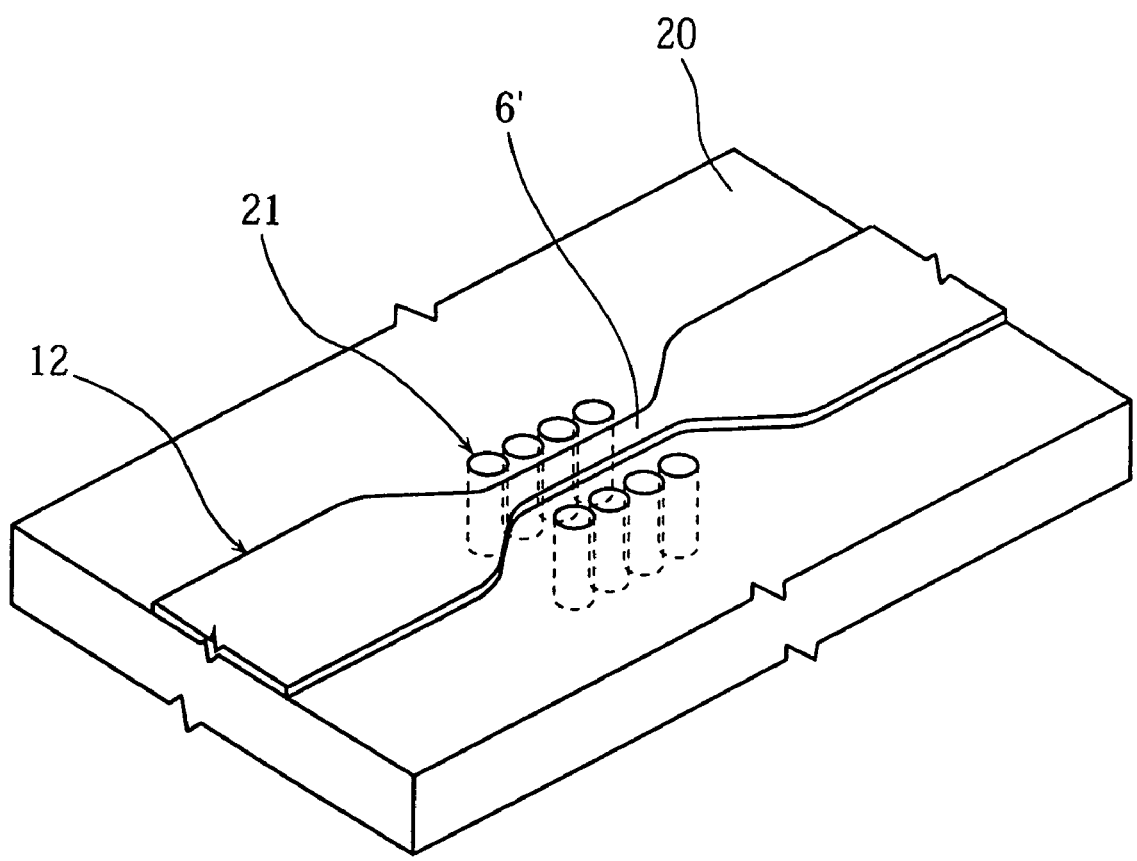
FIG. 6 is a detail view of the fuse provided to the printed wiring board in FIG. 5.

As shown in FIG. 6, the fuse 6' is realized by making part of the wiring pattern 12 relatively narrow in width. The wiring pattern 12 including the fuse 6' can be formed subjecting the conductor film formed on the substrate 20 to etching in a specific pattern by photolithography.

With the second embodiment of the present invention, a plurality of through holes 21 are formed in the substrate 20 in the vicinity of the fuse 6'. The illustrated through holes 21 (eight of them in FIG. 6) are divided into two equal groups, and sandwich the fuse 6' on either side. With this configuration, the air inside the through holes 21 acts as a thermal insulator, making it less likely that joule heat generated by the fuse 6' will be transmitted through the substrate 20. Accordingly, the fuse 6' will always be melted by the generated joule heat when excess current flows into the fuse 6'. The through holes 21 are formed by drilling, for example. The extent to which the joule heat generated by the fuse 6' is diffused through the substrate 20 can be adjusted by varying the shape, size, and number of the through holes 21.

Figure 7:
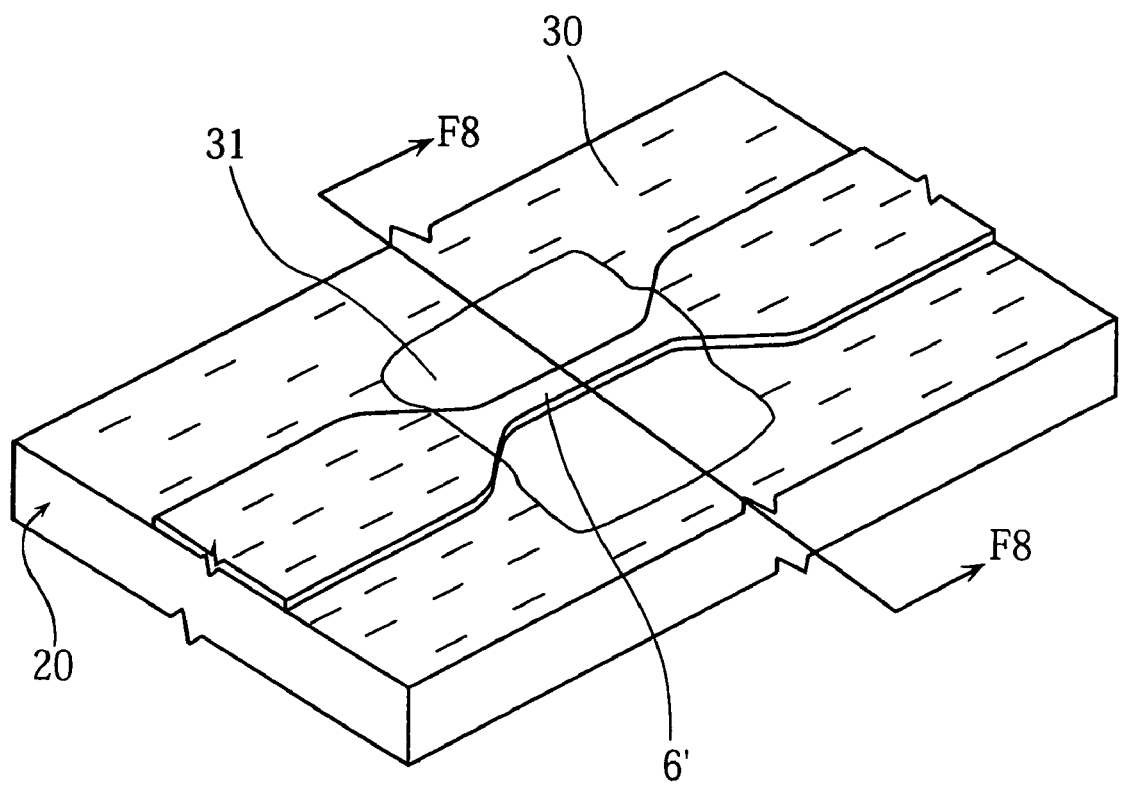
FIG. 7 is a detail view of the resist layer provided in the vicinity of the fuse in FIG. 6.
Figure 8:
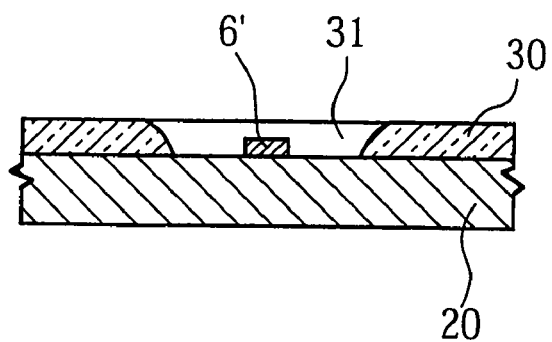
FIG. 8 is a cross section along the F8—F8 line in FIG. 7.

After the formation of the wiring pattern 12, as shown in FIG. 7, a resist layer 30 made of an epoxy or acrylic resin, for example, is formed on the substrate 20. This prevents the wiring pattern 12 from being corroded or damaged. Preferably, the fuse 6' is exposed on the outside by providing an opening 31 in the resist layer 30. This keeps the heat generated by the fuse 6' from escaping through the resist layer 30.

Figure 9:
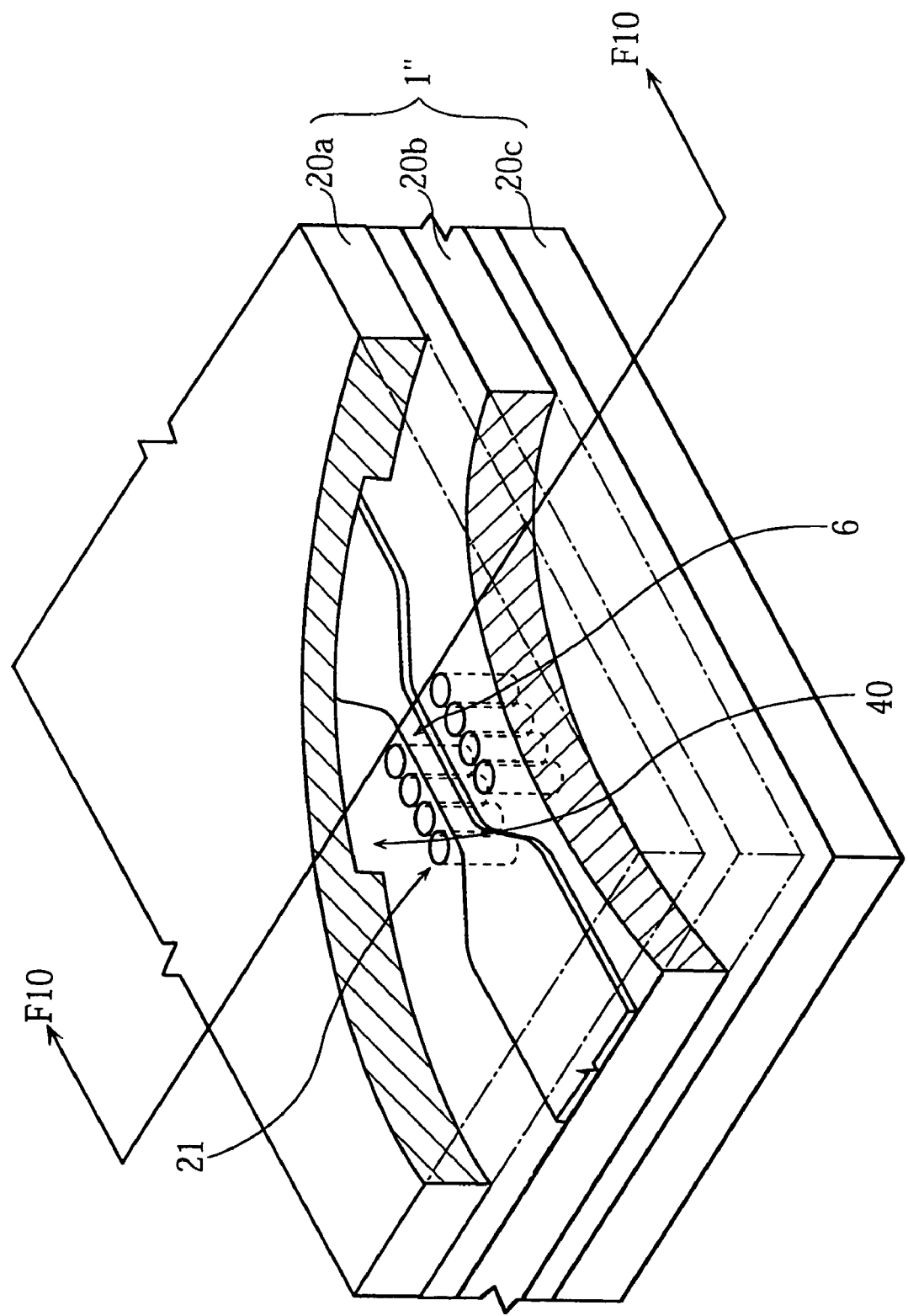
FIG. 9 is a detail view of the main part of the printed wiring board pertaining to a third embodiment of the present invention.
Figure 10:
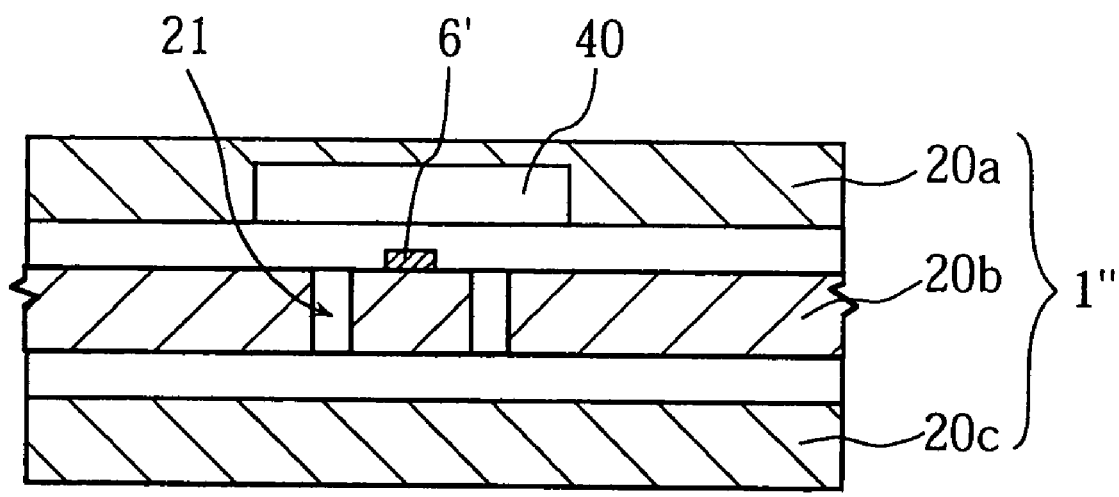
FIG. 10 is a cross section along the F10—F10 line in FIG. 9.

FIGS. 9 and 10 illustrate the main parts of a printed wiring board 1" in a third embodiment of the present invention. In this embodiment, the printed wiring board 1" includes first to third insulating substrates 20a, 20b, and 20c. Although not shown in the drawings, specific wiring patterns are formed on the upper and/or lower sides of the substrates 20a to 20c. The same fuse 6' and through holes 21 as in the second embodiment are formed in the second substrate 20b (see FIG. 6). In the third embodiment, though, nothing is provided corresponding to the resist layer 30 in FIG. 7.

As shown well in FIG. 10, a recess 40 facing the fuse 6' is formed in the first substrate 20a. With this configuration, joule heat generated by the fuse 6' can be prevented from being directly transmitted to the first substrate 20a. If an additional insulating substrate is provided over the first substrate 20*a*, through holes may be formed in the first substrate 20*a* instead of the recess 40.

Figure 11:
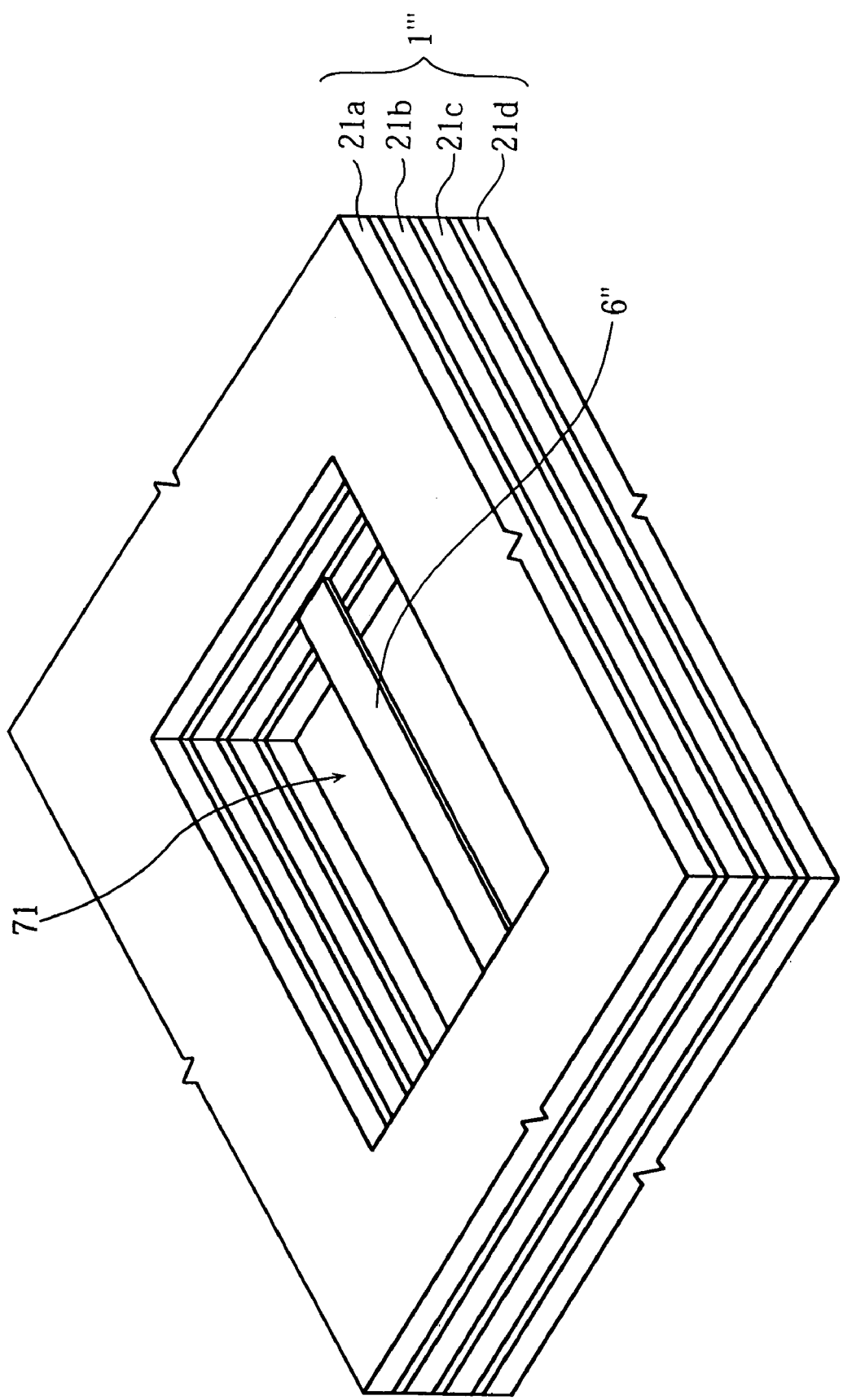
FIG. 11 is a detail view of the main part of the printed wiring board pertaining to a fourth embodiment of the present invention.
Figure 12:
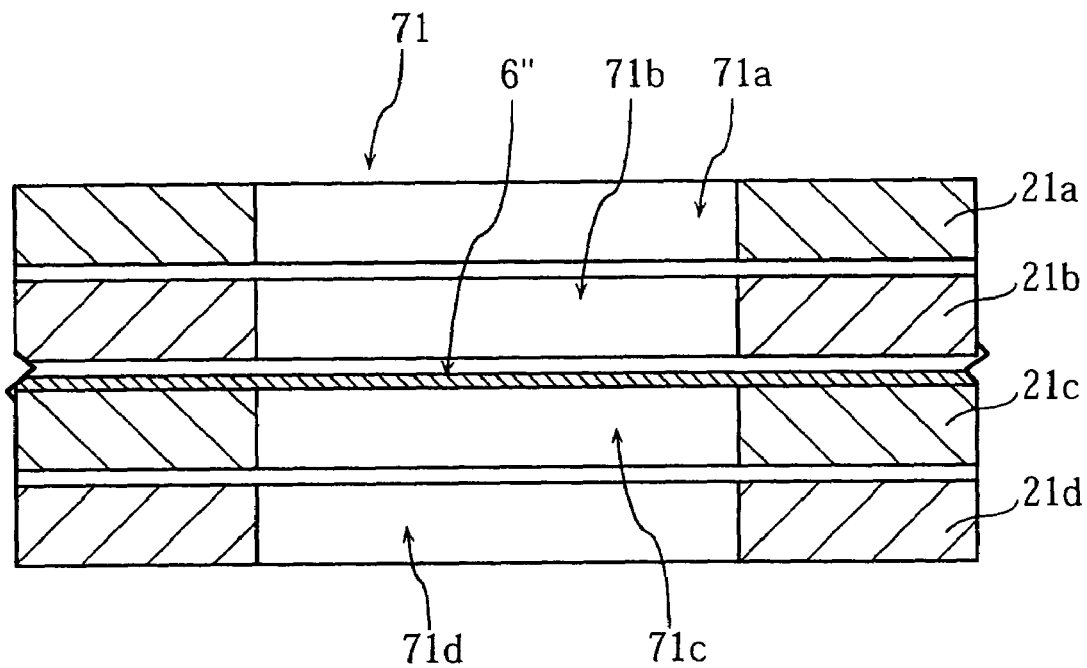
FIG. 12 is a cross section of the portion shown in FIG. 11.

FIGS. 11 and 12 illustrate a fuse 6" provided to a printed wiring board 1'" pertaining to a fourth embodiment of the present invention. The printed wiring board 1'" includes first to fourth substrates 21*a* to 21*d*, and a specific wiring pattern is formed on the upper and/or lower side of each of these substrates. These wiring patterns are electrically connected to each other via through holes provided in the substrates 21*a* to 21*d* (see 13 in FIG. 15).

As shown in FIG. 12, the fuse 6" is provided to the third substrate 21*c*. The fuse 6" is exposed to the outside via through holes 71 consisting of openings 71*a* to 71*d* formed in the substrates 21*a* to 21*d*, respectively.

The fuse 6" is provided as part of the wiring pattern formed on the third substrate 21*c*, and bridges the opening 21*c*. The fuse 6" can be formed by first forming the specific wiring pattern on the substrate 21*c*, and then making the opening 21*c* in the substrate 21*c*. An etching technique that acts only on the substrate 21*c*, for example, can be used to form this opening.

Figure 13:
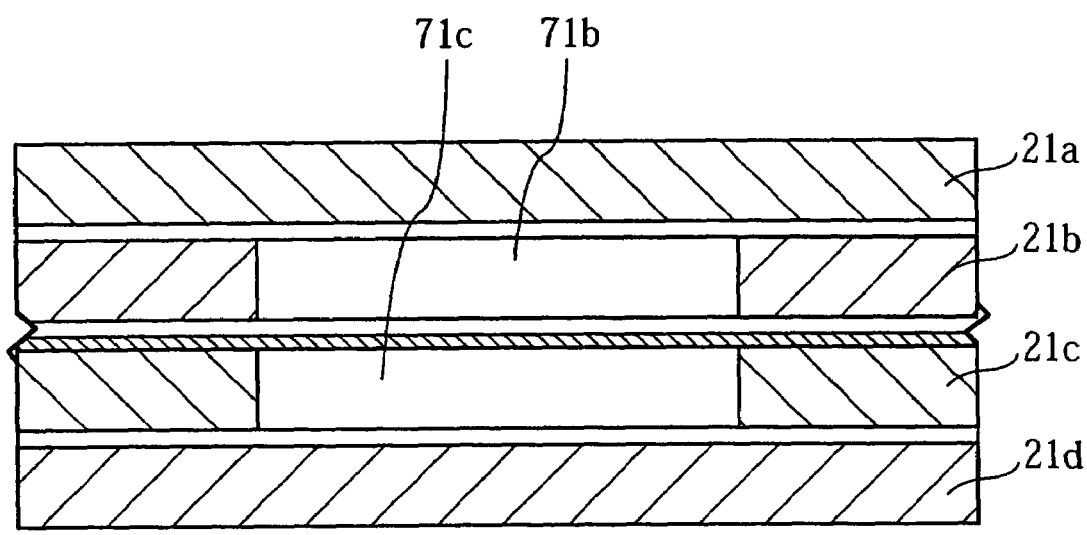
FIG. 13 shows a modification of the structure shown in FIG. 12.
Figure 14:
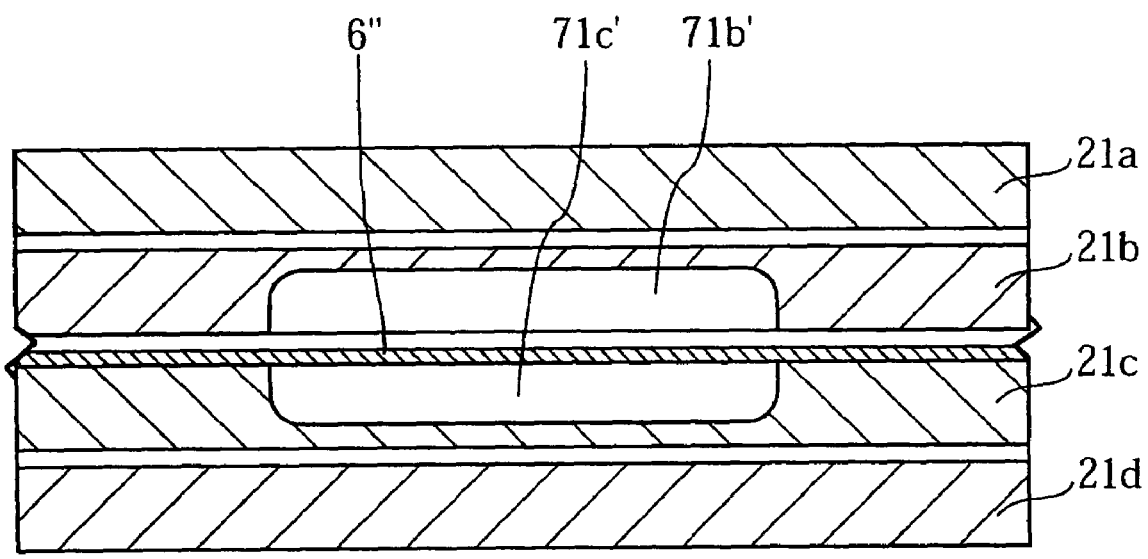
FIG. 14 is another modification of the structure shown in FIG. 12.

The openings 71*a* to 71*d* are provided to each of the respective substrates 21*a* to 21*d* in the embodiment illustrated in FIGS. 11 and 12, but the present invention is not limited to this. For instance, as shown in FIG. 13, openings 71*c* and 71*d* that communicate with each other can be provided to just the second and third substrates 21*b* and 21*c*. Alternatively, as shown in FIG. 14, recesses 71*b*' and 71*c*' that communicate with each other may be provided to the second and third substrates 21*b* and 21*c*.

Figure 15:
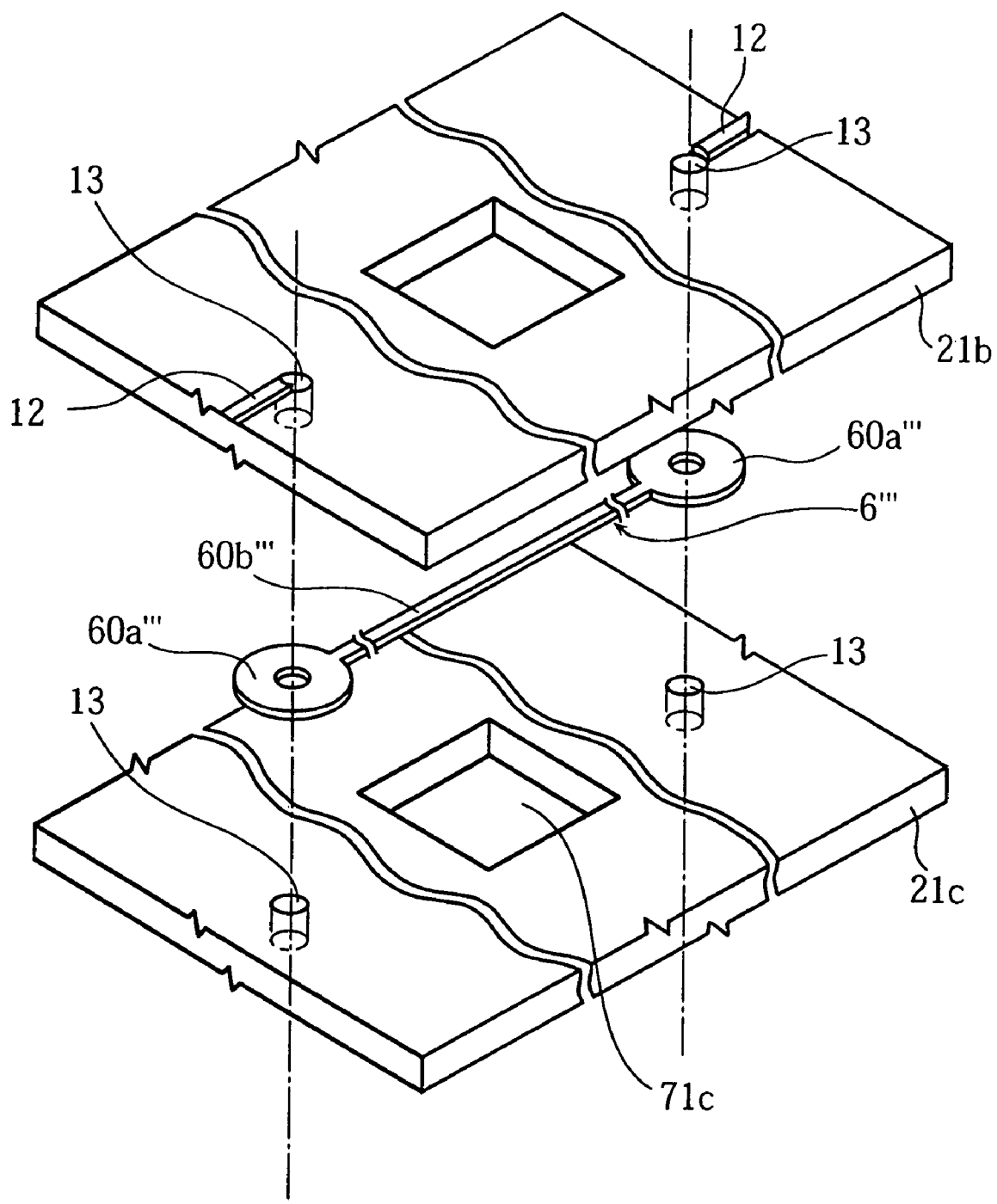
FIG. 15 is an exploded view of the structure of the fuse in FIG. 11.
Figure 16:
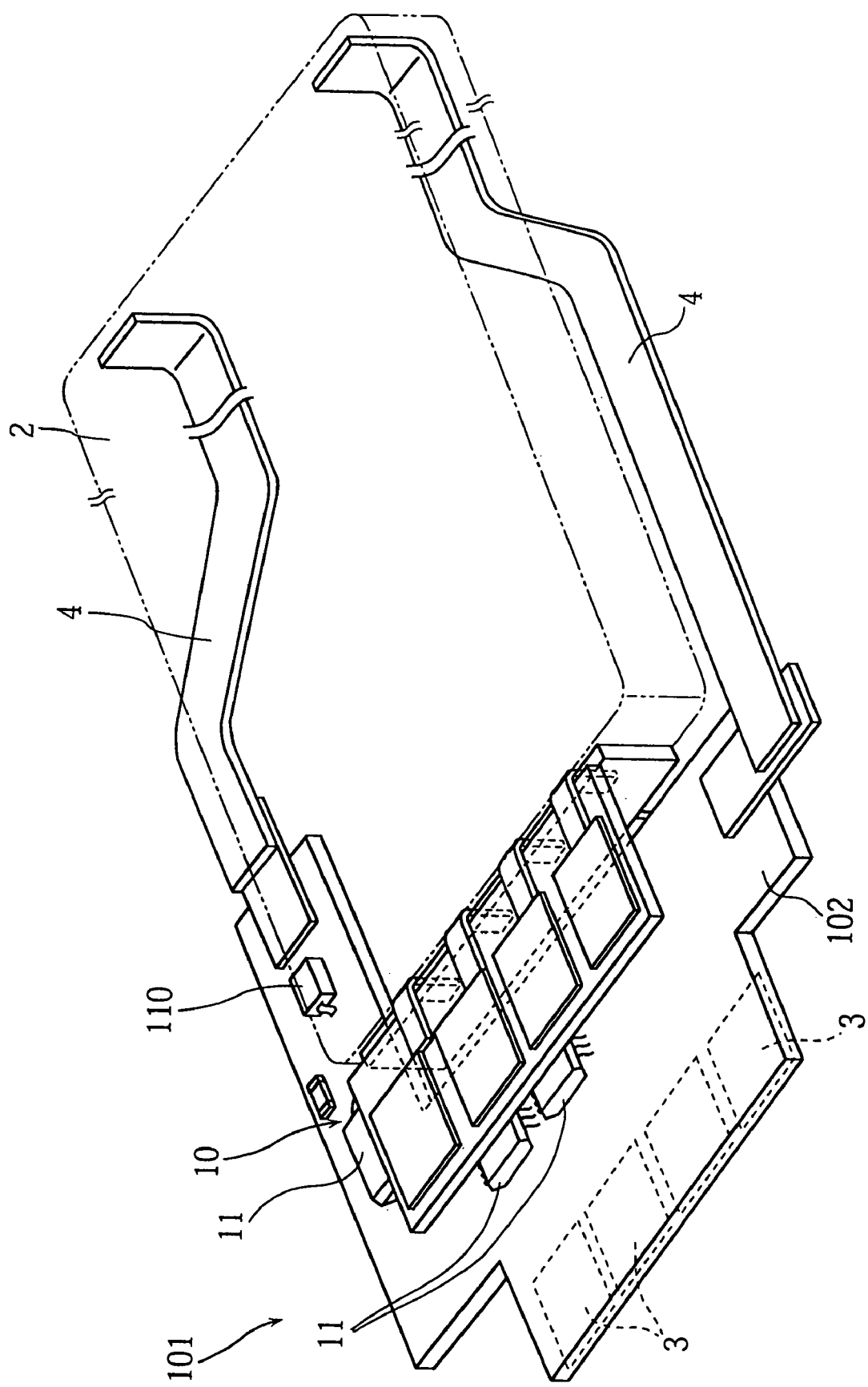
FIG. 16 is a perspective view of the structure of a conventional battery pack.
Figure 17:
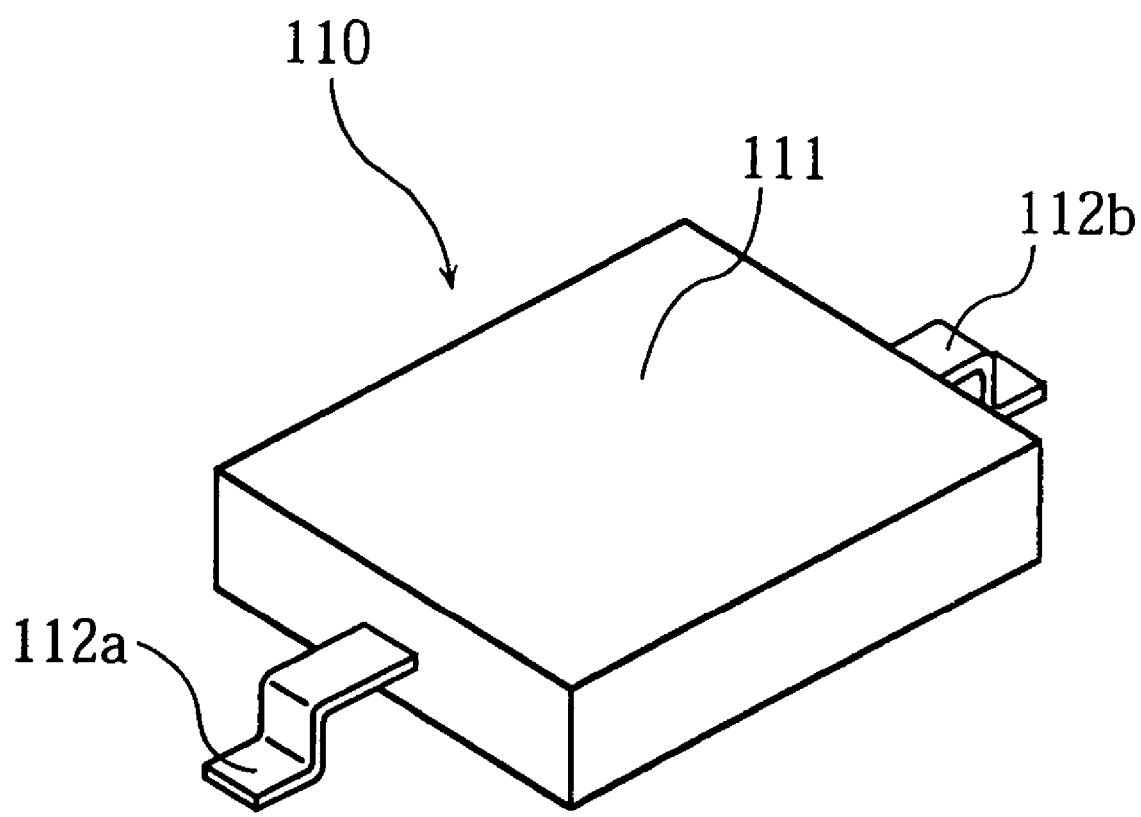
FIG. 17 is a perspective view of a conventional fuse.

Also, the fuse 6" is formed as part of the wiring pattern in the embodiment illustrated in FIGS. 11 and 12, but the present invention is not limited to this. For instance, as shown in FIG. 15, a fuse 6'" readied separately from the 2p may be used. In this case, the opening 71*c* can be formed by drilling or another such mechanical means. In the illustrated embodiment, the fuse 6'" comprises two terminals 60*a*'" and a middle portion 12*b* that extends between these terminals. The terminals 60*a*'" are electrically connected to the wiring pattern 12 on the second substrate 21*b* via the through holes 13.

The present invention was described above, but it is obvious that this can be modified into other embodiments. These modifications are within the concept and scope of the present invention, and all changes that would be obvious to a person skilled in the art are encompassed in the claims given below.

The invention claimed is:

1. A printed wiring board comprising:
   a first insulating substrate with a wiring pattern formed thereon;
   a fuse including circuit breaking means formed integral with the wiring pattern; and
   a second insulating substrate,
   wherein the first insulating substrate is provided with two heat insulator groups arranged to sandwich the circuit breaking means, each of said heat insulator groups including a plurality of through holes formed in the first insulating substrate,
   wherein the second insulating substrate is formed with a recess facing the circuit breaking means.

2. The board according to claim 1, wherein the circuit breaking means is a relatively narrow portion of the wiring pattern.

3. The board according to claim 2, wherein the wiring pattern is made of copper.

4. The board according to claim 1, wherein the plurality of through holes is arranged in a row extending in parallel to the circuit breaking means.

* * * * *